United States Patent
Yang et al.

(12) 
(10) Patent No.: US 6,946,359 B2
(45) Date of Patent: Sep. 20, 2005

(54) METHOD FOR FABRICATING TRENCH ISOLATIONS WITH HIGH ASPECT RATIO

(75) Inventors: Sheng-Wei Yang, Taipei (TW); Neng-Tai Shih, Taipei (TW); Wen-Sheng Liao, Taipei (TW); Chih-How Chang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 17 days.

(21) Appl. No.: 10/690,999

(22) Filed: Oct. 22, 2003

(65) Prior Publication Data

US 2005/0016948 A1 Jan. 27, 2005

(30) Foreign Application Priority Data

Jul. 23, 2003 (TW) .......................................... 92120044 A

(51) Int. Cl.$^7$ ............................................. H01L 21/302
(52) U.S. Cl. ....................... 438/425; 438/427; 438/430; 438/435; 438/692; 438/696; 438/704; 438/763
(58) Field of Search ................................. 438/425, 427, 438/430, 435, 692, 696, 704, 763, 433, 788

(56) References Cited

U.S. PATENT DOCUMENTS

| 6,251,735 B1 | | 6/2001 | Lou | |
|---|---|---|---|---|
| 6,339,004 B1 | * | 1/2002 | Kim | .......................... 438/296 |
| 6,737,334 B2 | * | 5/2004 | Ho et al. | ..................... 438/424 |
| 2003/0143852 A1 | * | 7/2003 | En-Ho et al. | ................ 438/694 |
| 2004/0058507 A1 | * | 3/2004 | Ho et al. | ..................... 438/424 |

FOREIGN PATENT DOCUMENTS

| TW | 404001 | * | 9/2000 |
| TW | 448537 | | 8/2001 |

* cited by examiner

Primary Examiner—George A. Goudreau
(74) Attorney, Agent, or Firm—Quintero Law Office

(57) ABSTRACT

A method of fabricating a trench isolation with high aspect ratio. The method comprises the steps of: providing a substrate with a trench; depositing a first isolation layer filling the trench by low pressure chemical vapor deposition; etching the first isolation layer so that its surface is lowered to the opening of the trench; depositing a second isolation layer to fill the trench without voids by high density plasma chemical vapor deposition and achieving global planarization by chemical-mechanical polishing then providing a rapidly annealing procedure. Accordingly, the present invention achieves void-free trench isolation with high aspect ratio.

28 Claims, 5 Drawing Sheets

METHOD FOR FABRICATING TRENCH ISOLATIONS WITH HIGH ASPECT RATIO

BACKGROUND OF THE INVENTION

1. Field of the Invention

The present invention relates to a method for fabricating semiconductor integrated circuits, and more specifically to a method for fabricating trench isolations with high aspect ratio.

2. Description of the Related Art

Recently, as fabrication techniques for semiconductor integrated circuits have developed, the number of elements in a chip has increased. Element size has integration density has increased. Fabrication line width has decreased from sub-micron to quarter-micron, and smaller. Regardless of the reduction in element size, however, adequate insulation or isolation must be is required among individual elements in a chip so that optimal performance can be achieved. This technique is called device isolation technology. The main object is to form isolations among individual elements, reducing their size as much as possible, ensuring superior isolation while creating more chip space for more elements.

Among the different element isolation techniques LOCOS and trench isolation are the most commonly used. The trench isolation technique has received particular notice as it provides a small isolation region and the substrate surface remains level post process. The conventional high density plasma chemical vapor deposition (HDPCVD) method for fabricating trench isolations with high aspect ratio, in excess of 6, for example, requires multiple deposition and etching cycles, thus it is expensive and offers reduced yield. Additionally, as the density of integrated circuits increases and element size is reduced, HPCVD provides inadequate step coverage resulting in incompletely filled trenches, and is detrimental to isolation between elements.

Currently, the low pressure chemical vapor deposition (LPCVD) method is typically employed to step coverage. To further illustrate the process, FIGS. 1A to 1B show the fabrication method in cross sections.

First, referring to FIG. 1A, a pad layer is formed on a semiconductor substrate 10. For example, a pad oxide layer 11 is formed on a silicon substrate by CVD or thermal oxidation, and a pad nitride layer 12 is deposited on the pad oxide layer 11 by CVD. The pad oxide layer 11 and the pad nitride layer 12 comprise the pad layer. Next, the pad oxide layer 11 and the pad nitride layer 12 are patterned by photolithography and etching to expose the area of the semiconductor substrate 10 where the element isolation region is to be formed. The patterned pad layer is subsequently used as a mask to etch the semiconductor substrate 10, and a trench is formed therein for the element isolation region.

Next, referring to FIG. 1B, thermal oxidation is performed to grow an oxide liner 14 covering the bottom and sidewalls of the trench. Subsequently, a nitride liner 16 is formed conformally on the pad layer and the oxide liner 14. LPCVD is then performed, for example, using TEOS as the reactant to deposit a TEOS layer 18 as a dielectric layer, completely filling the trench shown in FIG. 1B. Although LPCVD can improve step it has some drawbacks as shown in FIG. 1C.

Referring to FIG. 1C, as the aspect ratio of the trench exceeds 6, the conventionally deposited (by LPCVD) TEOS layer 18, may have voids 20 near the opening of the trench. The voids 20 are then filled with etching solution, thus the TEOS layer 18 is etched and larger void formations are created therein. Larger voids result in structural instability and reduced element reliability. Additionally, to improve the inferior TEOS dielectric characteristics it is necessary to perform a high temperature thermal annealing procedure with longer reaction time. The intensive thermal annealing procedure, however, often adversely affects the peripheral elements.

SUMMARY OF THE INVENTION

In order to overcome the disadvantages of the conventional method, an object of the invention is to provide a method for fabricating trench isolations that improves the gap-filling properties of the dielectric layer and provide a rapid thermal annealing procedure. The invention provides a simple and low-cost fabrication process.

The method for fabricating trench isolations provided in the invention includes the following steps. First, a semiconductor substrate with a trench is provided, and a first dielectric layer is formed on the substrate and fills the trench by LPCVD. Next, the first dielectric layer is etched, so that its surface is lowered below the opening of the trench. Subsequently, a second dielectric layer is formed on the first dielectric layer by HDPCVD. Then, the second dielectric layer is planarized by CMP. Finally, a rapid thermal annealing procedure is performed.

The present invention combines both LPCVD and HDPCVD with adequate process sequence and conditions. The advantages of this combination are described in the following. The invention eliminates the complicated and expensive multiple deposition and etching cycles required by conventional HDPCVD, thus simplifying the process and reducing the cost thereof. A second dielectric layer with superior dielectric characteristics is deposited on the first dielectric layer, so that the lengthy conventional annealing can be replaced by a rapid thermal annealing procedure, thus improving the characteristics of the second dielectric layer. The anisotropic etching and wet etching using hydrogen fluoride lower the surface of the first dielectric layer, by a specific height, to the opening of the trench, thus filling voids near the opening of the trench and providing improved gap-filling properties.

Another method for fabricating trench isolations provided in the invention includes the following steps. First, a semiconductor substrate with a first trench with a relatively high aspect ratio and a second trench with a relatively low aspect ratio is provided, and a first dielectric layer is formed on the substrate and fills both trenches by LPCVD. Next, the first dielectric layer is etched, and its surface is lowered by a specific height below the opening of the first trench, and a spacer is formed simultaneously on the sidewalls of the second trench. A second dielectric layer is subsequently formed on the first dielectric layer by HDPCVD. The second dielectric layer is then planarized by CMP. Finally, a rapid thermal annealing procedure is performed. In addition to the above advantages, the method of the present invention is also suitable for fabricating elements having trenches with different aspect ratios, such as SOC (system on a chip) or 100 nm DRAM.

According to a preferred embodiment of the invention, the reactant of the LPCVD is TEOS. The TEOS layer formed on the substrate and the sidewalls of the trench is etched by anisotropic etching and wet etching using hydrogen fluoride in order, facilitating subsequent HDPCVD. The second dielectric layer is deposited by HDPCVD using $O_2$ and $SiH_4$ as reactants with Ar sputtering.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

FIGS. 2A~2E illustrate cross sections of the method for fabricating a trench isolation according to the invention.

Figure 1A:
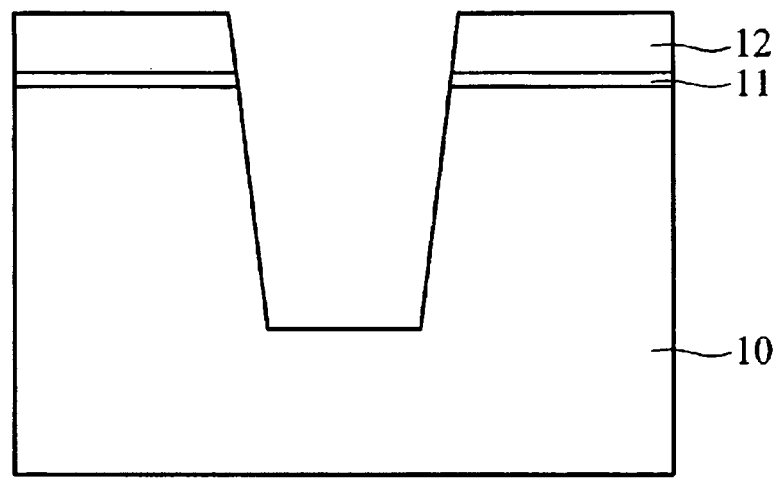
FIGS. 1A~1B are cross sections of fabricating a trench isolation by using the conventional LPCVD method.
Figure 1B:
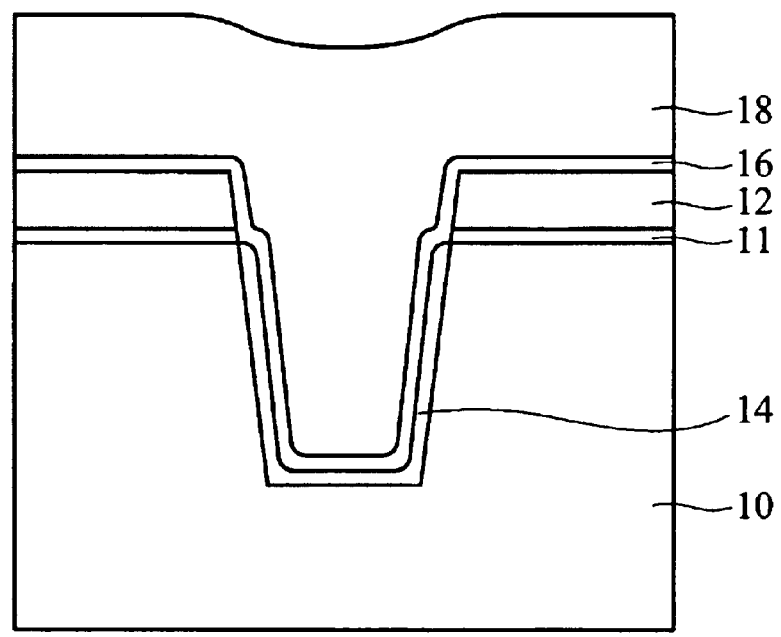
Figure 1C:
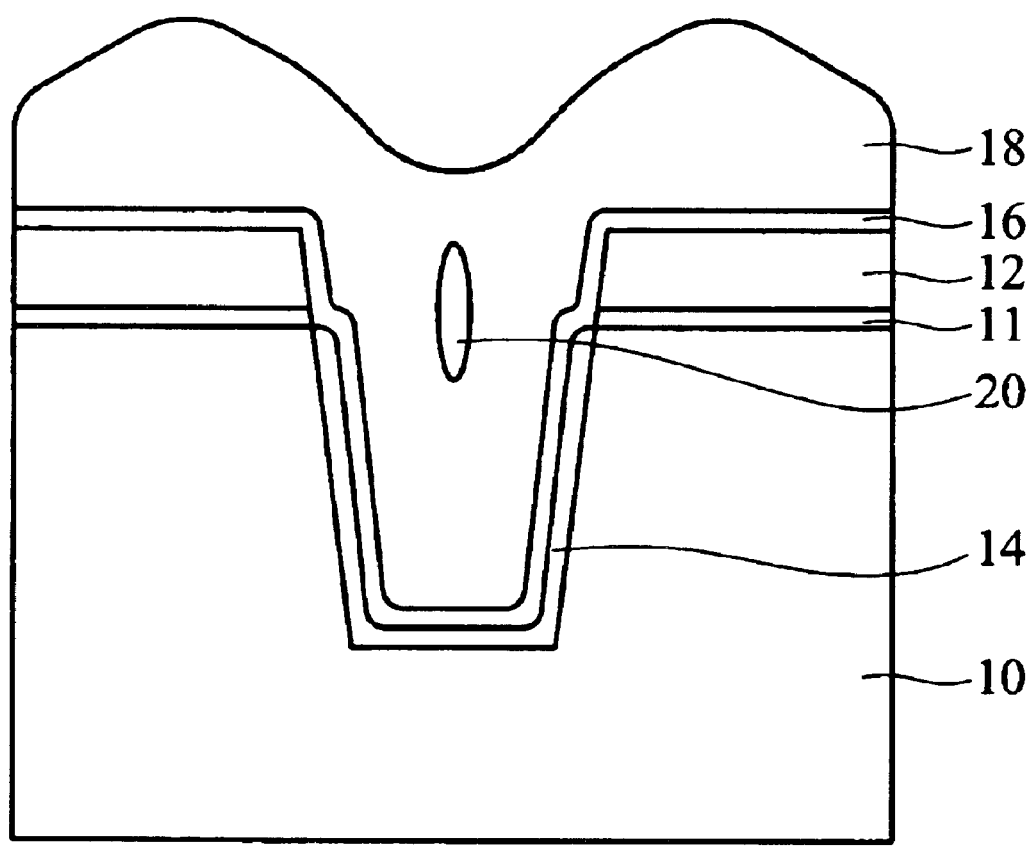
FIG. 1C shows the drawbacks of the prior art.
Figure 2A:
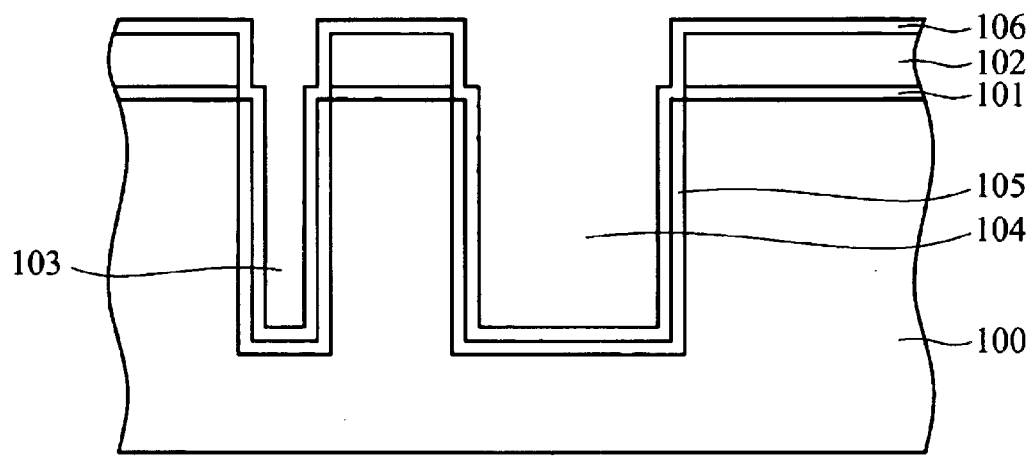
FIGS. 2A~2E are cross sections of the method for fabricating a trench isolation in a preferred embodiment of the invention.

FIG. 2A, illustrates the initial step of the invention, in which a pad oxide layer 101 is formed on a semiconductor substrate 100, such as a silicon substrate, by CVD or thermal oxidation. A pad nitride layer 102 is then deposited on the pad oxide layer 101 by CVD. The pad oxide layer 101 and the pad nitride layer 102 comprise a pad layer. Next, the pad oxide layer 101 and the pad nitride layer 102 are patterned by photolithography and etching to expose the area of semiconductor substrate 100, where the element isolation region is to be formed. The patterned pad layer is subsequently used as a mask to etch the semiconductor substrate 100; a first trench 103 with a relatively high aspect ratio and a second trench 104 with a relatively low aspect ratio are then formed. Thermal oxidation is performed to grow an oxide liner 105 covering the bottom and sidewalls of the trench. Subsequently, a nitride liner 106 is formed conformally on the pad layer and the oxide liner 105.

Figure 2B:
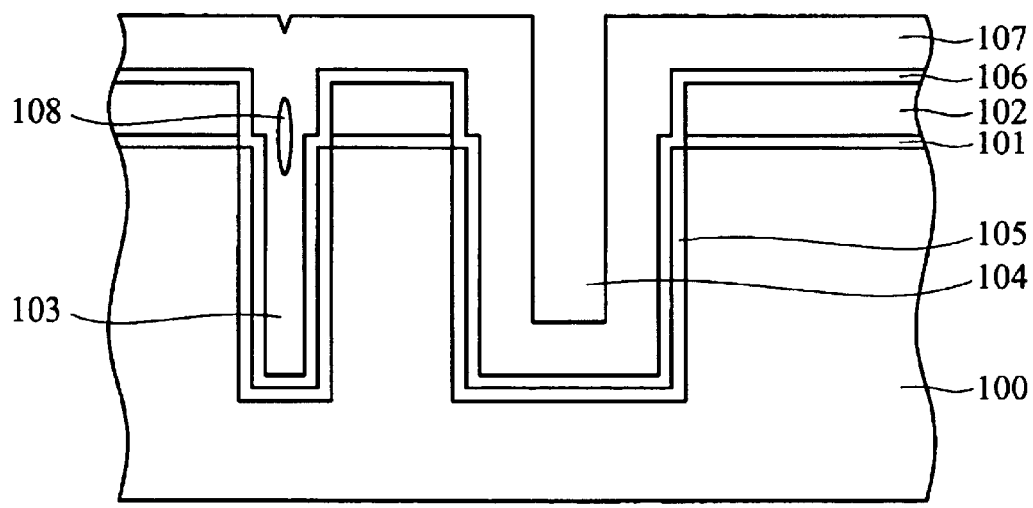

Referring next to FIG. 2B, LPCVD is performed, for example, using TEOS as the reactant to deposit a first dielectric layer 107 on the nitride liner 106. The thickness of the first dielectric layer 107 is about 500~3500 Å. Voids 108 appear near the opening of the first trench 103 while the first dielectric layer 107 fills the first trench 103 with higher aspect ratio.

Figure 2C:
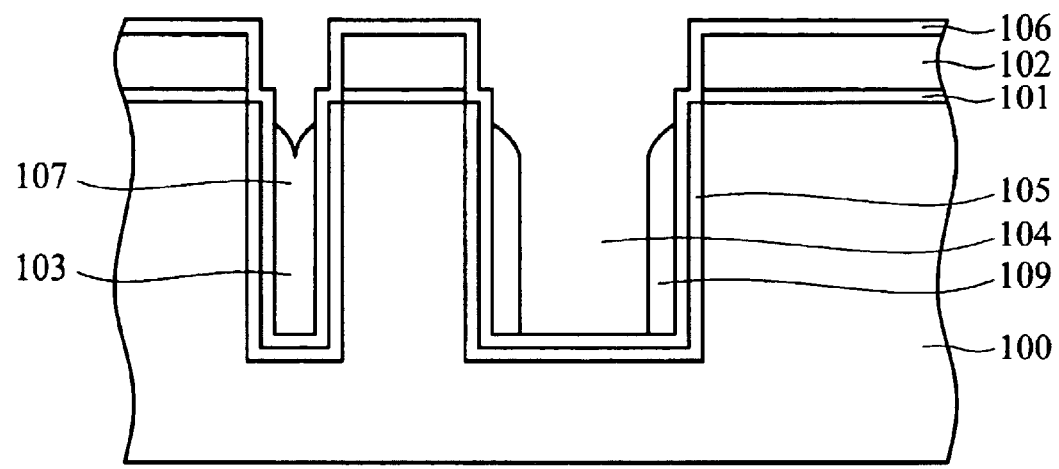

FIG. 2C illustrates the etching step, including anisotropic etching such as RIE or plasma etching and the wet etching using hydrogen fluoride, wherein hydrogen fluoride is a diluted solution, with a concentration ratio of 200:1. After etching, the surface of the first dielectric layer 107 is lowered by about 100~1000 Å below the opening of the first trench 103, and the first dielectric layer 107 forms a spacer 109 on the sidewalls of the second trench 104 simultaneously.

Figure 2D:
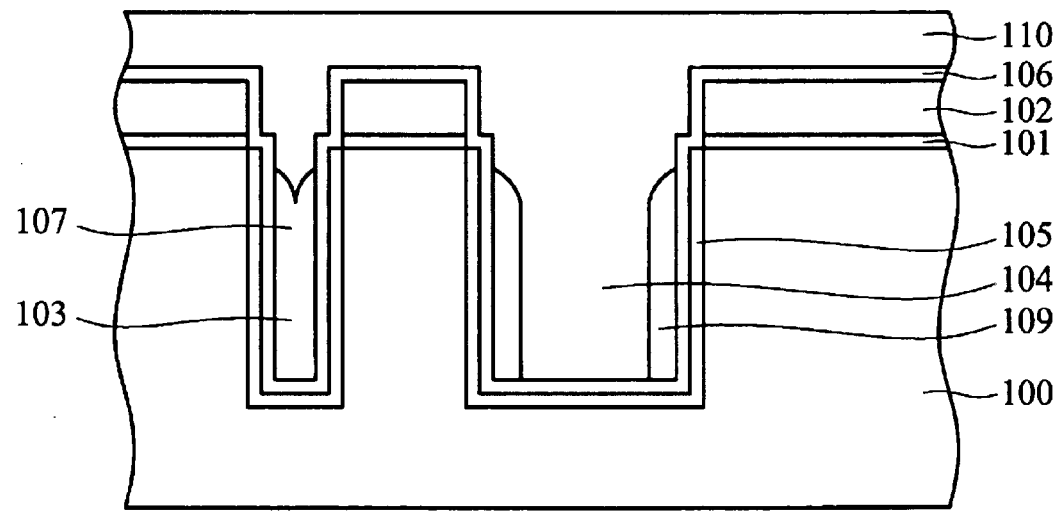

Subsequently, referring to FIG. 2D, the second dielectric layer 110 is deposited on the first dielectric layer 107 by HDPCVD using $O_2$ and $SiH_4$ as reactants with Ar sputtering. The HDPCVD begins with a relatively low deposition/sputtering ratio and is followed by a relatively high deposition/sputtering ratio.

Figure 2E:
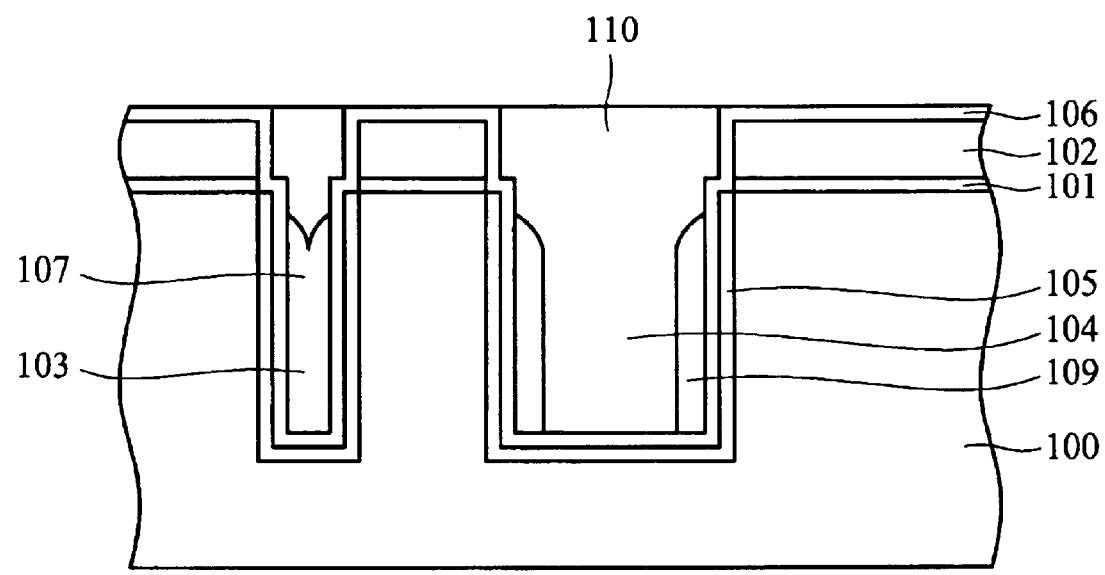

Finally, referring to FIG. 2E, a planarization process, such as CMP, which can be either slurry-based CMP or fixed abrasive CMP is performed to remove the uneven second dielectric layer 110 covering the pad nitride layer 102, and leave the second dielectric layer 110 inside the trench. Subsequently, a rapid thermal annealing procedure is performed at 900° C. for about 15~30 min to increase the mechanical robustness of the entire isolation structure. The pad nitride layer 102 and the pad oxide layer 101 are then removed using appropriate liquid or etching to expose the element region. Accordingly, the trench isolation of the present invention is achieved.

Compared to the prior art, the method for fabricating a trench isolation of the present invention has several advantages. First, the present invention prevents void formations near the opening of the trench. Second, the conventional method using HDPCVD usually requires 7 or 9 steps to accomplish this task. Thus, by combining both LPCVD and HDPCVD the present invention is simple and cost-effective. Finally, the rapid thermal annealing procedure reduces the adverse effects on peripheral elements. Accordingly, the present invention obtains trench isolation with low or high aspect ratio without voids, resulting in increased quality thereof.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating trench isolations, comprising:
    (a) providing a substrate with a trench therein, the trench comprising an opening;
    (b) forming a first dielectric layer on the substrate and filling in the trench by low pressure chemical vapor deposition (LPCVD);
    (c) lowering the first dielectric layer below the opening of the trench by performing separate steps of anisotropic etching and wet etching; and
    (d) forming a second dielectric layer on the first dielectric layer and filling the trench to form a trench isolation by high density plasma chemical vapor deposition (HDPCVD).

2. The method as claimed in claim 1, wherein step (a) further comprises steps of:
    providing the substrate with a pad layer thereon;
    defining a pattern on the pad layer;
    etching the trench in the substrate using the pattern as a mask;
    forming an oxide liner on the bottom and sidewalls of the trench by thermal oxidation; and
    forming a nitride liner conformally on the pad layer and the oxide liner.

3. The method as claimed in claim 2, wherein the pad layer comprises a pad oxide layer and a pad nitride layer overlying the pad oxide layer.

4. The method as claimed in claim 1, wherein the aspect ratio of the trench exceeds 6.

5. The method as claimed in claim 1, wherein the first dielectric layer is TEOS.

6. The method as claimed in claim 5, wherein the thickness of the first dielectric layer is about 800~3500 Å.

7. The method as claimed in claim 1, wherein the first dielectric layer is lowered about 100~1000 Å below the opening of the trench.

8. The method as claimed in claim 1, wherein HDPCVD is successively performed with a relatively low deposition/sputtering ratio and a relatively high deposition/sputtering ratio.

9. The method as claimed in claim 1, wherein the second dielectric layer is a silicon dioxide layer.

10. The method as claimed in claim 1, wherein the thickness of the second dielectric layer is about 2500~10000 Å.

11. The method as claimed in claim 1, further comprising, after HDPCVD, planarizing the dielectric layer and the pad layer.

12. The method as claimed in claim 11, wherein the planarizing is performed by CMP.

13. The method as claimed in claim 12, wherein the CMP includes slurry-based CMP or fixed abrasive CMP.

14. The method as claimed in claim 12, further comprising, after CMP, performing a rapid thermal annealing procedure.

15. A method for fabricating trench isolations, comprising:

(a) providing a substrate with a first trench with a relatively high aspect ratio and a second trench with a relatively low aspect ratio therein, each trench comprising an opening;

(b) forming a first dielectric layer on the substrate and filling the trenches by LPCVD;

(c) lowering the surface of the first dielectric layer below the openings of the both trenches by etching, wherein the first dielectric layer forms a spacer on the sidewalls of the second trench; and (d) forming a second dielectric layer on the first dielectric layer and filling both trenches to form trench isolations by HDPCVD.

16. The method as claimed in claim 15, wherein step (a) further comprises steps of:

providing the substrate with a pad layer thereon;

defining a pattern on the pad layer;

etching a first trench with a relatively high aspect ratio and a second trench with a relatively low aspect ratio in the substrate using the pattern as a mask;

forming an oxide liner on the bottom and sidewalls of both trenches by thermal oxidation; and forming a nitride liner conformally on the pad layer and the oxide liner.

17. The method as claimed in claim 16, wherein the pad layer comprises a pad oxide layer and the pad nitride layer overlying the pad oxide layer.

18. The method as claimed in claim 15, wherein the first dielectric layer is TEOS.

19. The method as claimed in claim 18, wherein the thickness of the first dielectric layer is about 500~3500 Å.

20. The method as claimed in claim 15, wherein the etching is performed by separate steps of anisotropic etching and wet etching using hydrogen fluoride.

21. The method as claimed in claim 15, wherein the surface of the first dielectric layer is lowered about 100~1000 Å below the opening of the trench.

22. The method as claimed in claim 15, wherein the HDPCVD is successively performed with a relatively low deposition/sputtering ratio and a relatively high deposition/sputtering ratio.

23. The method as claimed in claim 15, wherein the second dielectric layer is a silicon dioxide layer.

24. The method as claimed in claim 15, wherein the thickness of the second dielectric layer is about 2500~10000 Å.

25. The method as claimed in claim 15, further comprising, after HDPCVD, planarizing the dielectric layer and the pad layer.

26. The method as claimed in claim 25, wherein the planarizing is performed by CMP.

27. The method as claimed in claim 26, wherein the CMP includes slurry-based CMP or fixed abrasive CMP.

28. The method as claimed in claim 26, further comprising, after CMP, performing a rapid thermal annealing procedure.

* * * * *